United States Patent
Li (10) Patent No.: US 10,153,333 B1
(45) Date of Patent: Dec. 11, 2018

(54) METHOD FOR MANUFACTURING AN OLED BACKPLATE AND METHOD FOR MANUFACTURING AN OLED PANEL

(71) Applicant: Wuhan China Star Optoelectronics Semiconductor Display Technology Co., Ltd., Wuhan (CN)

(72) Inventor: Songshan Li, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/570,382

(22) PCT Filed: Aug. 18, 2017

(86) PCT No.: PCT/CN2017/098175
§ 371 (c)(1),
(2) Date: Oct. 30, 2017

(30) Foreign Application Priority Data

Jul. 24, 2017 (CN) .......................... 2017 1 0608575

(51) Int. Cl.
*H01L 27/32* (2006.01)
*H01L 51/00* (2006.01)
(Continued)

(52) U.S. Cl.
CPC .......... *H01L 27/3246* (2013.01); *G03F 7/038* (2013.01); *G03F 7/039* (2013.01);
(Continued)

(58) Field of Classification Search
CPC . H01L 27/3246; H01L 51/56; H01L 51/0005; G03F 7/039; G03F 7/038; G03F 7/16; G03F 7/20
(Continued)

(56) References Cited

U.S. PATENT DOCUMENTS 6,399,257 B1    6/2002  Shirota et al.
2018/0205026 A1* 7/2018  Zhou ................... H01L 51/0003

FOREIGN PATENT DOCUMENTS

CN      1425201 A    6/2003
CN    101800166 A    8/2010
(Continued)

*Primary Examiner* — Anthony Ho
(74) *Attorney, Agent, or Firm* — Leong C. Lei (57) ABSTRACT

A method for manufacturing an OLED backplate and a method for manufacturing an OLED panel are provided. In the method for manufacturing the OLED backplate of the present disclosure, a protective photoresist layer is manufactured on a pixel defined layer in which the top surface thereof has a hydrophobic property and the side surfaces thereof have a hydrophilic property before an electrode layer is treated by an oxygen plasma to remove photoresist residues, thereby the top surface of the pixel defined layer covered by the protective photoresist layer is not affected by the oxygen plasma in the proceeding of an oxygen plasma treatment, and still has the hydrophobic property. Therefore, the properties of the top surface of the pixel defined layer having the hydrophobic property and the side surfaces of the pixel defined layer having the hydrophilic property are kept while the photoresist residues on the electrode layer is removed, and thus an OLED device can be easily manufactured by an ink-jet printing process.

13 Claims, 4 Drawing Sheets (51) Int. Cl.
*H01L 51/56* (2006.01)
*G03F 7/40* (2006.01)
*G03F 7/039* (2006.01)
*G03F 7/038* (2006.01)
*G03F 7/16* (2006.01)
*G03F 7/20* (2006.01)
*G03F 7/30* (2006.01)
*H01L 51/50* (2006.01)
*H01L 51/52* (2006.01)

(52) U.S. Cl.
CPC ............... *G03F 7/16* (2013.01); *G03F 7/20* (2013.01); *G03F 7/30* (2013.01); *G03F 7/40* (2013.01); *H01L 51/0005* (2013.01); *H01L 51/0018* (2013.01); *H01L 51/56* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 2227/323* (2013.01); *H01L 2251/308* (2013.01)

(58) Field of Classification Search
USPC .......................................................... 438/23
See application file for complete search history.

(56) References Cited

FOREIGN PATENT DOCUMENTS

| | | |
|---|---|---|
| CN | 105870157 A | 8/2016 |
| CN | 106784366 A | 5/2017 |
| CN | 107527939 A | 12/2017 |

* cited by examiner

METHOD FOR MANUFACTURING AN OLED BACKPLATE AND METHOD FOR MANUFACTURING AN OLED PANEL

BACKGROUND OF THE INVENTION

1. Field of the Invention

The present disclosure relates to a field of display technology, and more specifically to a method for manufacturing an OLED backplate and a method for manufacturing an OLED panel.

2. Description of the Prior Art

An OLED (Organic Light Emitting Diodes) display has the advantages of self-illumination, low driving voltage, high luminous efficiency, short response time, high definition and contrast ratio, wide viewing angle, wide usage temperature range, flexible display, and large-area full color display. Thus, the OLED display has been recognized as a display device with the most development potential.

The OLED display has an anode, an organic functional layer, and a cathode which are sequentially disposed on a substrate. At present, the different functional material layer and the cathode metal layer of the OLED display are prepared by a vacuum thermal evaporation process. That is, an organic small molecular material is heated in a vacuum chamber to sublimate or gasify to a material steam. The material steam is deposited on a glass substrate by the opening of a metal mask. However, the large scale commercialization of the OLED display is limited because of the high cost of the vacuum thermal evaporation process.

Ink-jet printing technologies have the advantages of high utilization ratio of material, and the like, and are key technologies for solving the cost problem of a large-size OLED display. In comparison to traditional vacuum evaporation processes, IP technologies have the advantages of saving material, mild processing conditions, more uniform film formation, and the like in the preparation of the emitting layer of an OLED device, and thus have a more potential for application. In this method, a desired pattern is formed by dropping a functional material ink into a predetermined pixel area with multiple nozzles and waiting the evaporation of the solvent thereof.

A pixel defined layer (PDL) is required to be prepared on the anode before ink-jet printing in order to define the pixel area of the OLED display. In general, we need that the top surface of the PDL has a hydrophobic property, such that ink droplets containing a dissolved OLED material can be easily flowed in a pixel groove defined by the PDL, and cannot be remained on the top surface of the PDL. On the other hand, we hope that the side surfaces of the PDL have a hydrophilic property, such that the droplets can be very uniformly deployed in the pixel groove, and will not produce an oversize contact angle on the side so that the film thickness thereof is thinner.

Figure 1:
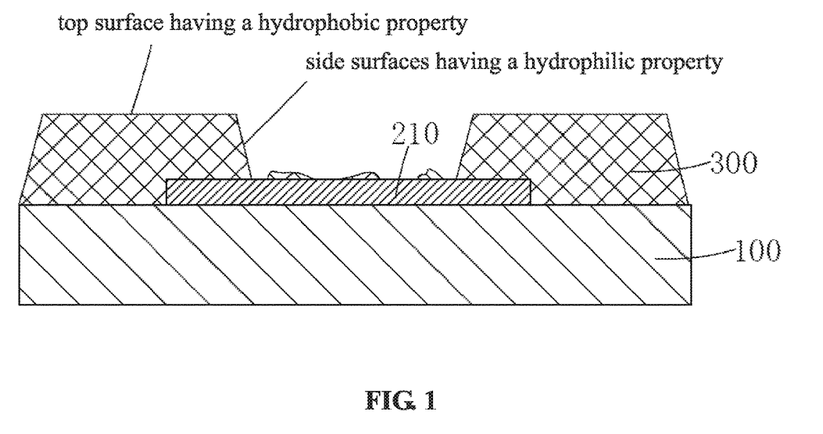
FIG. 1 is a schematic view of a PDL formed by a method for manufacturing an existing OLED backplate.
Figure 2:
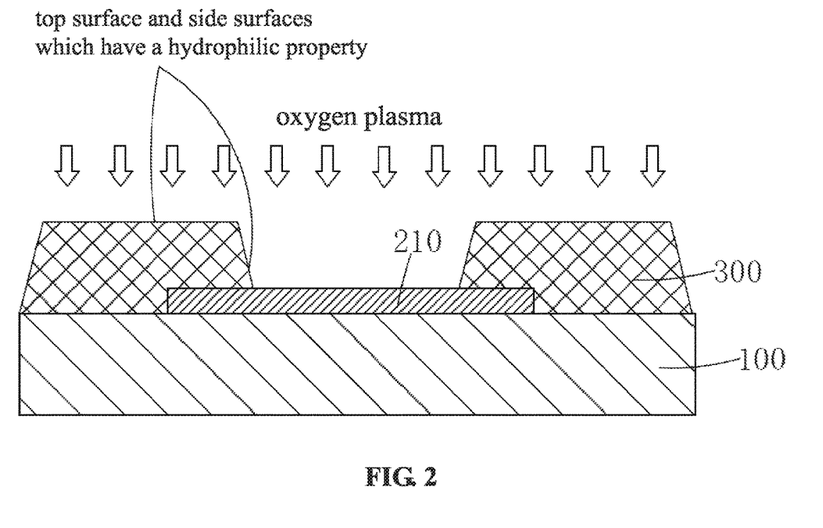
FIG. 2 is a schematic view of treating an ITO anode as shown in FIG. 1 by an oxygen plasma.

A method for manufacturing a PDL in a traditional OLED backplate is that: as shown in FIG. 1, an organic photoresist material is coated, exposed, developed and baked on a TFT substrate 100 having an ITO (indium tin oxide) anode 210 to obtain a PDL 300. At this point, the obtained PDL 300 occurs that the top surface thereof has a hydrophobic property and the side surfaces thereof have a hydrophilic property since the properties of the organic photoresist material itself. However, as shown in FIG. 2, the step of an oxygen plasma treatment ($O_2$ plasma treatment) in the whole surface is performed in order to remove organic photoresist residues on the ITO anode 210. All the exposed surfaces (i.e., the top surface and the side surfaces) of the PDL 300 are changed to a hydrophilic property by the process, and the contact angle thereof is smaller than 40°. Therefore, this does not meet the technological requirement for the top surface of the PDL 300 having a hydrophobic property and the side surfaces of the PDL 300 having a hydrophilic property in an IJP process, thereby affecting the proceeding of the subsequent IJP process.

SUMMARY OF THE INVENTION

An object of the present disclosure is to provide a method for manufacturing an OLED backplate, the properties of the top surface of a pixel defined layer having a hydrophobic property and the side surfaces of the pixel defined layer having a hydrophilic property are kept while photoresist residues on an electrode layer is removed, and thus an OLED device can be easily manufactured by an ink-jet printing process.

Also, an object of the present disclosure is to provide a method for manufacturing an OLED panel, the OLED backplate is manufactured by the above method for manufacturing the OLED backplate, and the photoresist residues on the electrode layer is removed to obtain the pixel defined layer in which the top surface thereof has the hydrophobic property and the side surfaces thereof have the hydrophilic property. Then, an organic functional layer is formed by the ink-jet printing process. Therefore, the process thereof is simple, and the manufactured OLED device has a more stable performance.

To achieve the above object, the present disclosure provides a method for manufacturing an OLED backplate. The method includes the following steps of:

step S1: providing a TFT substrate, forming an electrode layer onto the TFT substrate by a depositing process and a patterning process, coating a layer of organic photoresist material onto the electrode layer and the TFT substrate, and exposing, developing and baking the layer of organic photoresist material to form a pixel defined layer, in which the pixel defined layer has a pixel opening above the electrode layer, the pixel defined layer has side surfaces and a top surface, at this point, the side surfaces of the pixel defined layer have a hydrophilic property, the top surface of the pixel defined layer has a hydrophobic property, and the top surface of the electrode layer has photoresist residues thereon;

step S2: coating a layer of general photoresist material onto the pixel defined layer, patterning the layer of general photoresist material by a photolithography process, and forming a protective photoresist layer onto the pixel defined layer to protect the top surface of the pixel defined layer, in which the protective photoresist layer has a through opening above the pixel opening of the pixel defined layer, and the through opening fully exposes the corresponding pixel opening;

step S3: applying an oxygen plasma onto the entire surface of the TFT substrate, and treating the electrode layer by the oxygen plasma to remove the photoresist residues thereon, in which the top surface of the pixel defined layer covered by the protective photoresist layer is not affected by the oxygen plasma in the treating process, and the top surface of the pixel defined layer still has the hydrophobic property; and step S4: removing the protective photoresist layer on the pixel defined layer to obtain the OLED backplate.

In the step S2, the edge of the through opening in the protective photoresist layer is 0-3 micrometers greater outward extension than the edge of the corresponding pixel opening, thereby fully exposing the corresponding pixel opening.

In the step S1, the organic photoresist material is exposed by using a first mask, and the first mask has a first pattern for forming the pixel opening.

In the step S2, a specific process for forming the protective photoresist layer by the photolithography process and the patterning is that: a second mask is provided after the layer of general photoresist material is coated on the pixel defined layer, the second mask has a second pattern for forming the through opening, the layer of general photoresist material is exposed by using the second mask, and then the exposed general photoresist material is developed and baked to obtain the protective photoresist layer.

The shape of the second pattern corresponds to the shape of the first pattern. A distance between the edge and the center point of the second pattern is 1-3 μm greater than a distance between the corresponding edge and the center point of the first pattern.

The coated organic photoresist material in the step S1 includes polymethyl methacrylate.

The material of the formed electrode layer in the step S1 is indium tin oxide.

The electrode layer is used for constituting an OLED device, and the electrode layer is used as an anode or a cathode of the OLED device.

The present disclosure further provides a method for manufacturing an OLED panel. The method includes the following steps of: manufacturing an OLED backplate by the above method for manufacturing the OLED backplate; and forming an organic functional layer into the pixel opening of the OLED backplate by an ink-jet printing process, wherein the organic functional layer is a hole injection layer, a hole transport layer, an emitting layer, an electron transport layer, or an electron injection layer of an OLED device.

The present disclosure further provides a method for manufacturing an OLED backplate. The method includes the following steps of:

step S1: providing a TFT substrate, forming an electrode layer onto the TFT substrate by a depositing process and a patterning process, coating a layer of organic photoresist material onto the electrode layer and the TFT substrate, and exposing, developing and baking the layer of organic photoresist material to form a pixel defined layer, in which the pixel defined layer has a pixel opening above the electrode layer, the pixel defined layer has side surfaces and a top surface, at this point, the side surfaces of the pixel defined layer have a hydrophilic property, the top surface of the pixel defined layer has a hydrophobic property, and the top surface of the electrode layer has photoresist residues thereon;

step S2: coating a layer of general photoresist material onto the pixel defined layer, patterning the layer of general photoresist material by a photolithography process, and forming a protective photoresist layer onto the pixel defined layer to protect the top surface of the pixel defined layer, in which the protective photoresist layer has a through opening above the pixel opening of the pixel defined layer, and the through opening fully exposes the corresponding pixel opening;

step S3: applying an oxygen plasma onto the entire surface of the TFT substrate, and treating the electrode layer by the oxygen plasma to remove the photoresist residues thereon, in which the top surface of the pixel defined layer covered by the protective photoresist layer is not affected by the oxygen plasma in the treating process, and the top surface of the pixel defined layer still has the hydrophobic property; and step S4: removing the protective photoresist layer on the pixel defined layer to obtain the OLED backplate, where in the step S2, the edge of the through opening in the protective photoresist layer is 0-3 micrometers greater outward extension than the edge of the corresponding pixel opening, thereby fully exposing the corresponding pixel opening;

where in the step S1, the organic photoresist material is exposed by using a first mask, and the first mask has a first pattern for forming the pixel opening;

where in the step S2, a specific process for forming the protective photoresist layer by the photolithography process and the patterning is that: a second mask is provided after the layer of general photoresist material is coated on the pixel defined layer, the second mask has a second pattern for forming the through opening, the layer of general photoresist material is exposed by using the second mask, and then the exposed general photoresist material is developed and baked to obtain the protective photoresist layer;

where the shape of the second pattern corresponds to the shape of the first pattern, and a distance between the edge and the center point of the second pattern is 1-3 μm greater than a distance between the corresponding edge and the center point of the first pattern.

The present disclosure has the following beneficial effects. In the method for manufacturing the OLED backplate provided by the present disclosure, the protective photoresist layer is manufactured on the pixel defined layer in which the top surface thereof has the hydrophobic property and the side surfaces thereof have the hydrophilic property before the electrode layer is treated by the oxygen plasma to remove the photoresist residues, thereby the top surface of the pixel defined layer covered by the protective photoresist layer is not affected by the oxygen plasma in the proceeding of an oxygen plasma treatment, and still has the hydrophobic property. Therefore, the properties of the top surface of the pixel defined layer having the hydrophobic property and the side surfaces of the pixel defined layer having the hydrophilic property are kept while the photoresist residues on the electrode layer is removed, and thus the OLED device can be easily manufactured by the ink-jet printing process. In the method for manufacturing the OLED panel of the present disclosure, the OLED backplate is manufactured by the above method for manufacturing the OLED backplate, and the photoresist residues on the electrode layer is removed to obtain the pixel defined layer in which the top surface thereof has the hydrophobic property and the side surfaces thereof have the hydrophilic property. Then, the organic functional layer is formed by the ink-jet printing process. Therefore, the process thereof is simple, and the manufactured OLED device has a more stable performance and a longer working life.

For better understanding of the features and technical contents of the present disclosure, reference will be made to the following detailed description of the present disclosure and the attached drawings. However, the drawings are provided for the purposes of reference and illustration and are not intended to impose undue limitations to the present disclosure.

BRIEF DESCRIPTION OF THE DRAWINGS

The technical solution, as well as beneficial advantages, of the present disclosure will be apparent from the following detailed description of an embodiment of the present disclosure, with reference to the attached drawings. In the drawings.

DETAILED DESCRIPTION OF THE PREFERRED EMBODIMENTS

To further expound the technical solution adopted in the present disclosure and the advantages thereof, a detailed description is given to a preferred embodiment of the present disclosure and the attached drawings.

Figure 3:
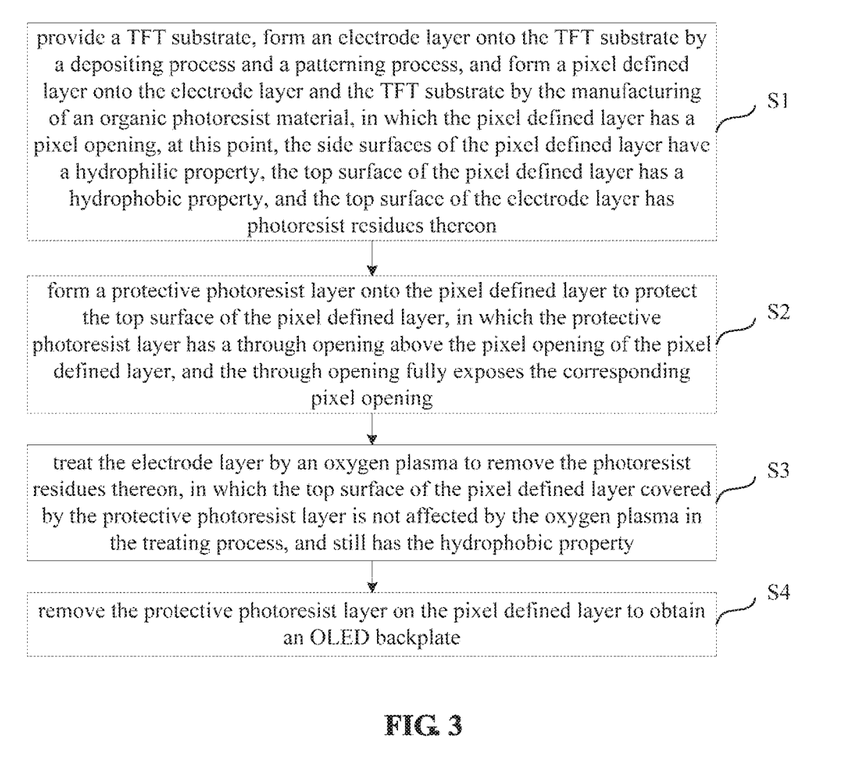
FIG. 3 is a flow chart of a method according to the present disclosure for manufacturing an OLED backplate.

Please refer to FIG. 3, the present disclosure first provides a method for manufacturing an OLED backplate. The method includes the following steps S1-S4.

Figure 4:
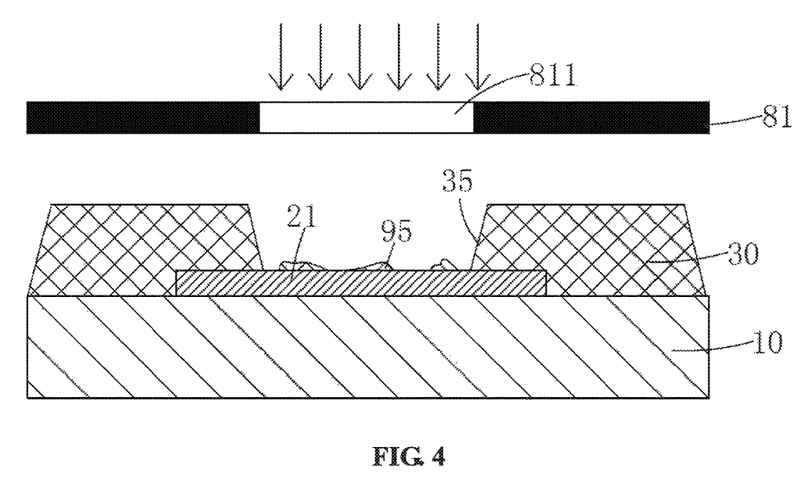
FIG. 4 is a schematic view of the step S1 of the method according to the present disclosure for manufacturing the OLED backplate.

In the step S1, please refer to FIG. 4, a TFT substrate 10 is provided, and an electrode layer 21 is formed on the TFT substrate 10 by a depositing process and a patterning process. A layer of organic photoresist material is coated on the electrode layer 21 and the TFT substrate 10. The layer of organic photoresist material is exposed, developed and baked to form a pixel defined layer 30. The pixel defined layer 30 has a pixel opening 35 above the electrode layer 21. The pixel defined layer 30 has side surfaces and a top surface. At this point, the side surfaces of the pixel defined layer 30 have a hydrophilic property, and the top surface of the pixel defined layer 30 has a hydrophobic property. The pixel defined layer 30 exposes the top surface of the electrode layer 21, and the top surface of the electrode layer 21 has photoresist residues 95 thereon.

Specifically, the level of hydrophilic and hydrophobic property in the present disclosure is evaluated by measuring the water contact angle of a surface. If a contact angle between the measured surface and water is greater than 90°, it has a hydrophobic property. If a contact angle between the measured surface and water is smaller than 40°, it has a hydrophilic property.

Specifically, in the step S1, the top surface of the pixel defined layer 30 has the hydrophobic property. More specifically, the water contact angle of the top surface is greater than 90°, and thus it also assumes that the top surface of the pixel defined layer 30 has the hydrophobic property. Also, the side surfaces of the pixel defined layer 30 have the hydrophilic property. More specifically, the water contact angle of the side surfaces is greater than 5° and is smaller than 40°, and thus it also assumes that the side surfaces of the pixel defined layer 30 have the hydrophilic property. Specifically, the surface of the electrode layer 21 also has a hydrophilic property, and has a more hydrophilic property than the side surfaces of the pixel defined layer 30. More specifically, the water contact angle of the surface of the electrode layer 21 is smaller than 5°.

Specifically, the coated organic photoresist material in the step S1 is a special photoresist material which has been widely used in industries. The special photoresist material is exposed, developed and baked by a photolithography process to obtain a pixel defined layer 30 which emerges the properties of the side surfaces thereof having a hydrophilic property and the top surface thereof having a hydrophobic property. However, if the side surfaces and top surface thereof are reacted by an oxygen plasma, they will all emerge a hydrophilic property. Further, the organic photoresist material usually includes polymethyl methacrylate.

Specifically, in the step S1, the organic photoresist material is exposed by using a first mask 81, and the first mask 81 has a first pattern 811 for forming the pixel opening 35.

Specifically, the material of the formed electrode layer 21 in the step S1 is indium tin oxide.

Figure 5:
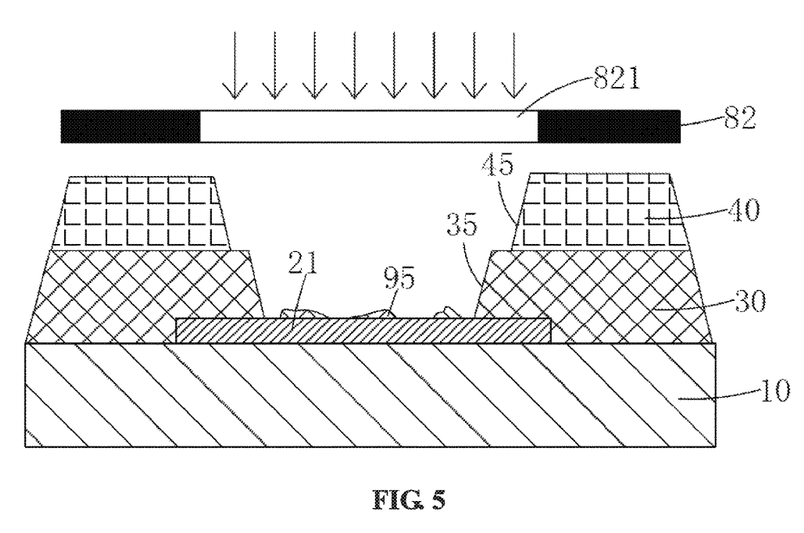
FIG. 5 is a schematic view of the step S2 of the method according to the present disclosure for manufacturing the OLED backplate.

In the step S2, please refer to FIG. 5, a layer of general photoresist material is coated on the pixel defined layer 30. The layer of general photoresist material is patterned by a photolithography process. A protective photoresist layer 40 is formed on the pixel defined layer 30 to protect the top surface of the pixel defined layer 30. The protective photoresist layer 40 has a through opening 45 above the pixel opening 35 of the pixel defined layer 30. The through opening 45 fully exposes the corresponding pixel opening 35. That is, the side surfaces of the pixel defined layer 30 are exposed.

Preferably, in the step S2, the through opening 45 of the protective photoresist layer 40 is able to fully expose the corresponding pixel opening 35, and the protective photoresist layer 40 is able to fully cover the top surface of the pixel defined layer 30. That is, the edge of the through opening 45 overlaps the edge of the corresponding pixel opening 35. However, the precision problems of existing processes are considered, thereby allowing that the edge of the through opening 45 in the protective photoresist layer 40 is 0-3 micrometers greater outward extension than the edge of the corresponding pixel opening 35, thus fully exposing the corresponding pixel opening 35.

Specifically, in the step S2, a specific process for forming the protective photoresist layer 40 by the photolithography process and the patterning is that: a second mask 82 is provided after the layer of general photoresist material is coated on the pixel defined layer 30, the second mask 82 has a second pattern 821 for forming the through opening 45, the layer of general photoresist material is exposed by using the second mask 82, and then the exposed general photoresist material is developed and baked to obtain the protective photoresist layer 40.

Specifically, the shape of the second pattern 821 is corresponded to the shape of the first pattern 811. A distance between the edge and the center point of the second pattern 821 is 1-3 μm greater than a distance between the corresponding edge and the center point of the first pattern 811.

Figure 6:
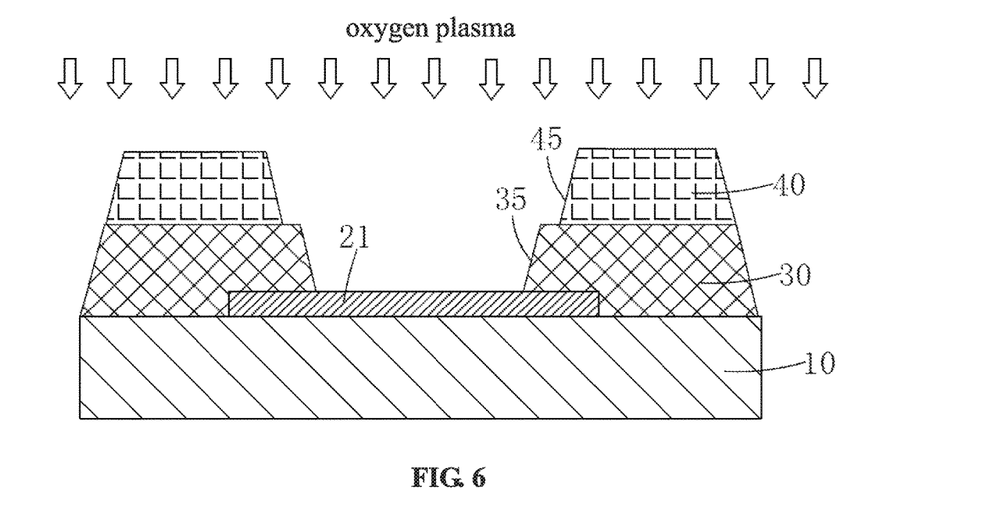
FIG. 6 is a schematic view of the step S3 of the method according to the present disclosure for manufacturing the OLED backplate.

In the step S3, please refer to FIG. 6, an oxygen plasma is applied on the entire surface of the TFT substrate 10. The electrode layer 21 is treated by the oxygen plasma to remove the photoresist residues 95 thereon. The top surface of the pixel defined layer 30 covered by the protective photoresist layer 40 is not affected by the oxygen plasma in the treating process, and the top surface of the pixel defined layer still has the hydrophobic property.

Specifically, in the step S3, the surfaces of the pixel defined layer 30 where are not covered are affected by the oxygen plasma, thereby having the hydrophilic property.

That is, the side surfaces of the pixel defined layer 30 still keep the hydrophilic property. Further, the water contact angle of the side surfaces is greater than 5° and is smaller than 40°. The top surface of the pixel defined layer 30 where are not covered by the protective photoresist layer 40 is changed to a hydrophilic property since it is affected by the oxygen plasma. Further, the water contact angle of the part is greater than 5° and is smaller than 40°.

Figure 7:
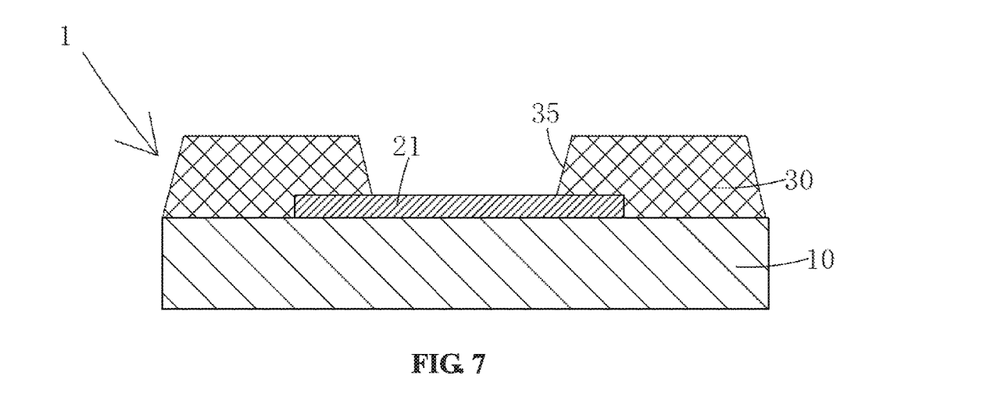
FIG. 7 is a schematic view of the step S4 of the method according to the present disclosure for manufacturing the OLED backplate.

In the step S4, please refer to FIG. 7, the protective photoresist layer 40 on the pixel defined layer 30 is removed to obtain the OLED backplate 1.

Specifically, the electrode layer 21 is used for constituting an OLED device. The electrode layer 21 is used as an anode or a cathode of the OLED device.

In the method for manufacturing the OLED backplate of the present disclosure, the protective photoresist layer 40 is manufactured on the pixel defined layer 30 in which the top surface thereof has the hydrophobic property and the side surfaces thereof have the hydrophilic property before the electrode layer 21 is treated by the oxygen plasma to remove the photoresist residues 95, thereby the top surface of the pixel defined layer 30 covered by the protective photoresist layer 40 is not affected by the oxygen plasma in the proceeding of an oxygen plasma treatment, and still has the hydrophobic property. Therefore, the properties of the top surface of the pixel defined layer 30 having the hydrophobic property and the side surfaces of the pixel defined layer 30 having the hydrophilic property are kept while the photoresist residues 95 on the electrode layer 21 is removed, and thus the OLED device can be easily manufactured by an ink-jet printing process in the next process.

Accordingly, based on the above method for manufacturing the OLED backplate, the present disclosure further provides a method for manufacturing an OLED panel. The method includes the following steps of: manufacturing an OLED backplate 1 by the above method for manufacturing the OLED backplate, and removing the photoresist residues 95 on the electrode layer 21 to obtain the pixel defined layer 30 in which the top surface thereof has the hydrophobic property and the side surfaces thereof have the hydrophilic property (the specific manufacturing method will not be discussed here); and forming an organic functional layer into the pixel opening 35 of the pixel defined layer 30 by the ink-jet printing process. The organic functional layer is a hole injection layer (HIL), a hole transport layer (HTL), an emitting layer (EL), an electron transport layer (ETL), or an electron injection layer (EIL).

As mentioned above, in the method for manufacturing the OLED backplate provided by the present disclosure, the protective photoresist layer is manufactured on the pixel defined layer in which the top surface thereof has the hydrophobic property and the side surfaces thereof have the hydrophilic property before the electrode layer is treated by the oxygen plasma to remove the photoresist residues, thereby the top surface of the pixel defined layer covered by the protective photoresist layer is not affected by the oxygen plasma in the proceeding of an oxygen plasma treatment, and still has the hydrophobic property. Therefore, the properties of the top surface of the pixel defined layer having the hydrophobic property and the side surfaces of the pixel defined layer having the hydrophilic property are kept while the photoresist residues on the electrode layer is removed, and thus the OLED device can be easily manufactured by the ink-jet printing process. In the method for manufacturing the OLED panel of the present disclosure, the OLED backplate is manufactured by the above method for manufacturing the OLED backplate, and the photoresist residues on the electrode layer is removed to obtain the pixel defined layer in which the top surface thereof has the hydrophobic property and the side surfaces thereof have the hydrophilic property. Then, the organic functional layer is formed by the ink-jet printing process. Therefore, the process thereof is simple, and the manufactured OLED device has a more stable performance and a longer working life.

Based on the description given above, those having ordinary skills of the art may easily contemplate various changes and modifications of the technical solution and technical ideas of the present disclosure and all these changes and modifications are considered within the protection scope of right for the present disclosure.

What is claimed is:

1. A method for manufacturing an OLED backplate, comprising the following steps of:
    step S1: providing a TFT substrate, forming an electrode layer onto the TFT substrate by a depositing process and a patterning process, coating a layer of organic photoresist material onto the electrode layer and the TFT substrate, and exposing, developing and baking the layer of organic photoresist material to form a pixel defined layer, wherein the pixel defined layer has a pixel opening above the electrode layer, the pixel defined layer has side surfaces and a top surface, at this point, the side surfaces of the pixel defined layer have a hydrophilic property, the top surface of the pixel defined layer has a hydrophobic property, and a top surface of the electrode layer has photoresist residues thereon;
    step S2: coating a layer of general photoresist material onto the pixel defined layer, patterning the layer of general photoresist material by a photolithography process, and forming a protective photoresist layer onto the pixel defined layer to protect the top surface of the pixel defined layer, wherein the protective photoresist layer has a through opening above the pixel opening of the pixel defined layer, and the through opening fully exposes the corresponding pixel opening;
    step S3: applying an oxygen plasma onto an entire surface of the TFT substrate, and treating the electrode layer by the oxygen plasma to remove the photoresist residues thereon, wherein the top surface of the pixel defined layer covered by the protective photoresist layer is not affected by the oxygen plasma in the treating process, and the top surface of the pixel defined layer still has the hydrophobic property; and
    step S4: removing the protective photoresist layer on the pixel defined layer to obtain the OLED backplate.

2. The method for manufacturing the OLED backplate of claim 1, wherein in the step S2, an edge of the through opening in the protective photoresist layer is 0-3 micrometers greater outward extension than an edge of the corresponding pixel opening, thereby fully exposing the corresponding pixel opening.

3. The method for manufacturing the OLED backplate of claim 1, wherein in the step S1, the organic photoresist material is exposed by using a first mask, and the first mask has a first pattern for forming the pixel opening.

4. The method for manufacturing the OLED backplate of claim 3, wherein in the step S2, a specific process for forming the protective photoresist layer by the photolithography process and the patterning is that: a second mask is provided after the layer of general photoresist material is coated on the pixel defined layer, the second mask has a second pattern for forming the through opening, the layer of general photoresist material is exposed by using the second mask, and then the exposed general photoresist material is developed and baked to obtain the protective photoresist layer.

5. The method for manufacturing the OLED backplate of claim 4, wherein a shape of the second pattern is corresponded to a shape of the first pattern, and a distance between an edge and a center point of the second pattern is 1-3 μm greater than a distance between a corresponding edge and a center point of the first pattern.

6. The method for manufacturing the OLED backplate of claim 1, wherein the coated organic photoresist material in the step S1 comprises polymethyl methacrylate.

7. The method for manufacturing the OLED backplate of claim 1, wherein a material of the formed electrode layer in the step S1 is indium tin oxide.

8. The method for manufacturing the OLED backplate of claim 1, wherein the electrode layer is used for constituting an OLED device, and the electrode layer is used as an anode or a cathode of the OLED device.

9. A method for manufacturing an OLED panel, comprising the following steps of: manufacturing an OLED backplate by the method for manufacturing the OLED backplate of claim 1; and forming an organic functional layer into the pixel opening of the OLED backplate by an ink-jet printing process, wherein the organic functional layer is a hole injection layer, a hole transport layer, an emitting layer, an electron transport layer, or an electron injection layer of an OLED device.

10. A method for manufacturing an OLED backplate, comprising the following steps of:

step S1: providing a TFT substrate, forming an electrode layer onto the TFT substrate by a depositing process and a patterning process, coating a layer of organic photoresist material onto the electrode layer and the TFT substrate, and exposing, developing and baking the layer of organic photoresist material to form a pixel defined layer, wherein the pixel defined layer has a pixel opening above the electrode layer, the pixel defined layer has side surfaces and a top surface, at this point, the side surfaces of the pixel defined layer have a hydrophilic property, the top surface of the pixel defined layer has a hydrophobic property, and a top surface of the electrode layer has photoresist residues thereon;

step S2: coating a layer of general photoresist material onto the pixel defined layer, patterning the layer of general photoresist material by a photolithography process, and forming a protective photoresist layer onto the pixel defined layer to protect the top surface of the pixel defined layer, wherein the protective photoresist layer has a through opening above the pixel opening of the pixel defined layer, and the through opening fully exposes the corresponding pixel opening;

step S3: applying an oxygen plasma onto an entire surface of the TFT substrate, and treating the electrode layer by the oxygen plasma to remove the photoresist residues thereon, wherein the top surface of the pixel defined layer covered by the protective photoresist layer is not affected by the oxygen plasma in the treating process, and the top surface of the pixel defined layer still has the hydrophobic property; and step S4: removing the protective photoresist layer on the pixel defined layer to obtain the OLED backplate, wherein in the step S2, an edge of the through opening in the protective photoresist layer is 0-3 micrometers greater outward extension than an edge of the corresponding pixel opening, thereby fully exposing the corresponding pixel opening;

wherein in the step S1, the organic photoresist material is exposed by using a first mask, and the first mask has a first pattern for forming the pixel opening;

wherein in the step S2, a specific process for forming the protective photoresist layer by the photolithography process and the patterning is that: a second mask is provided after the layer of general photoresist material is coated on the pixel defined layer, the second mask has a second pattern for forming the through opening, the layer of general photoresist material is exposed by using the second mask, and then the exposed general photoresist material is developed and baked to obtain the protective photoresist layer;

wherein a shape of the second pattern is corresponded to a shape of the first pattern, and a distance between an edge and a center point of the second pattern is 1-3 μm greater than a distance between a corresponding edge and a center point of the first pattern.

11. The method for manufacturing the OLED backplate of claim 10, wherein the coated organic photoresist material in the step S1 comprises polymethyl methacrylate.

12. The method for manufacturing the OLED backplate of claim 10, wherein a material of the formed electrode layer in the step S1 is indium tin oxide.

13. The method for manufacturing the OLED backplate of claim 10, wherein the electrode layer is used for constituting an OLED device, and the electrode layer is used as an anode or a cathode of the OLED device.

* * * * *